(12) United States Patent
Tolentino et al.

(10) Patent No.: US 11,776,870 B2
(45) Date of Patent: Oct. 3, 2023

(54) DIRECT BONDED COPPER SUBSTRATES FABRICATED USING SILVER SINTERING

(71) Applicant: SEMICONDUCTOR COMPONENTS INDUSTRIES, LLC, Phoenix, AZ (US)

(72) Inventors: Erik Nino Mercado Tolentino, Negeri Sembilan (MY); Shutesh Krishnan, Negeri Sembilan (MY); Francis J. Carney, Mesa, AZ (US)

(73) Assignee: SEMICONDUCTOR COMPONENTS INDUSTRIES, LLC, Phoenix, AZ (US)

( * ) Notice: Subject to any disclaimer, the term of this patent is extended or adjusted under 35 U.S.C. 154(b) by 415 days.

(21) Appl. No.: 16/744,378

(22) Filed: Jan. 16, 2020

(65) Prior Publication Data

US 2021/0225730 A1 Jul. 22, 2021

(51) Int. Cl.
*H01L 23/373* (2006.01)
*B22F 7/06* (2006.01)
*H01L 21/48* (2006.01)
*H01L 23/00* (2006.01)

(52) U.S. Cl.
CPC .......... *H01L 23/3735* (2013.01); *B22F 7/064* (2013.01); *H01L 21/4882* (2013.01); *B22F 2301/10* (2013.01); *H01L 24/09* (2013.01); *H01L 24/29* (2013.01)

(58) Field of Classification Search
CPC ............. H01L 23/3735; H01L 21/4882; H01L 23/49534; H01L 23/49537; H01L 21/4846; H01L 23/49805; H01L 23/49838; H01L 23/49861; H01L 24/29; H01L 24/09; B22F 2301/10; B22F 2007/042; C04B 2235/656; C04B 2237/124; C04B 2237/125; C04B 2237/343; C04B 2237/36; C04B 2237/366; C04B 2237/368; C04B 2237/706; C04B 2237/72; C04B 37/021; C04B 37/026
See application file for complete search history.

(56) References Cited

U.S. PATENT DOCUMENTS

| | | | | |
|---|---|---|---|---|
| 4,883,704 A | * | 11/1989 | Sato | H05K 1/0306 428/209 |
| 9,922,894 B1 | * | 3/2018 | Viswanathan | H01L 23/047 |
| 2009/0152237 A1 | | 6/2009 | Chiang et al. | |
| 2010/0288536 A1 | * | 11/2010 | Chiang | H01L 33/64 156/60 |
| 2013/0328204 A1 | * | 12/2013 | Zommer | H01L 24/09 228/205 |

(Continued)

*Primary Examiner* — Patricia D Valenzuela
(74) *Attorney, Agent, or Firm* — Brake Hughes Bellermann LLP

(57) ABSTRACT

A method includes applying a sintering precursor material layer to each of a first surface and a second surface of a ceramic tile, and assembling a precursor assembly of a direct bonded copper (DBC) substrate by coupling a first leadframe on the sinter precursor material layer on the first surface of the ceramic tile and a second leadframe on the second surface of the sinter precursor material layer on a second surface of the ceramic tile such that the ceramic tile is disposed between the first leadframe and the second leadframe. The method further includes sinter bonding the first leadframe and the second leadframe to the ceramic tile to form a sinter bonded DBC substrate.

20 Claims, 5 Drawing Sheets

(56) References Cited

U.S. PATENT DOCUMENTS

| | | | |
|---|---|---|---|
| 2014/0183716 A1* | 7/2014 | Zommer | H01L 23/3735 438/123 |
| 2015/0055303 A1* | 2/2015 | Nagatomo | B23K 35/0222 361/715 |
| 2016/0104666 A1* | 4/2016 | Gowda | H01L 24/73 257/774 |
| 2017/0025335 A1* | 1/2017 | Liu | H01L 23/49524 |

* cited by examiner

```
┌─────────────────────────────────────────────────────────┐
│         Metalize one or more surfaces of a ceramic tile │
│                           210                           │
└─────────────────────────────────────────────────────────┘
                              │
┌─────────────────────────────────────────────────────────┐
│  Apply a sintering precursor material layer to each of a first surface and a │
│              second surface of the ceramic tile         │
│                           220                           │
└─────────────────────────────────────────────────────────┘
                              │
┌─────────────────────────────────────────────────────────┐
│ Assemble a precursor assembly of a direct bonded copper (DBC) substrate by │
│ coupling the first leadframe to the sinter precursor material layer applied on the │
│ first surface of the ceramic tile and the second leadframe to the sinter precursor │
│ material layer applied on the second surface of the ceramic tile such that the │
│ ceramic tile is disposed between the first leadframe and the second leadframe │
│                           230                           │
└─────────────────────────────────────────────────────────┘
                              │
┌─────────────────────────────────────────────────────────┐
│ Sinter bond the first leadframe and the second leadframe to the ceramic tile to │
│              obtain a sinter-bonded DBC substrate       │
│                           240                           │
└─────────────────────────────────────────────────────────┘
```

DIRECT BONDED COPPER SUBSTRATES FABRICATED USING SILVER SINTERING

TECHNICAL FIELD

This description relates to direct bonded copper substrates used in packaging of power devices.

BACKGROUND

Modern high-power devices (e.g., silicon power devices such as an insulated-gate bipolar transistor (IGBT), a fast recovery diode (FRD), etc.) can be fabricated using advanced silicon technology to meet high power requirements. The role of a substrate in power electronics is to provide the interconnections between the devices to form an electric circuit (like a printed circuit board), and to cool the components. The high-power devices (e.g., an IGBT, an FRD, etc.) may be packaged in single-side cooling (SSC) or dual-side cooling (DSC) power modules. Direct bonded copper (DBC) substrates are electronic circuit boards on which the power devices are mounted in the SSC and DSC power modules. The DBC substrates are commonly used because of their very good thermal conductivity that helps dissipate heat. The DBC substrates are composed of a ceramic tile (e.g., alumina) with a sheet of copper bonded to one or to both sides of the substrates by a high-temperature cladding process. With increasing demands on the performance of the power modules, the integrity and reliability of the DBC substrates themselves have become important. Internal defects (ceramic-copper interfacial voids, cracks, etc.) that are commonly seen during traditional DBC manufacturing processes now may be now unacceptable for good performance of the power modules.

SUMMARY

A direct bonded copper (DBC) substrate includes a ceramic tile, a first leadframe disposed on a first side of the ceramic tile, a second leadframe disposed on a second side of the ceramic tile, and a sinter bond between the first leadframe and the ceramic tile.

In a general aspect, a method includes applying a sintering precursor material layer to each of a first surface and a second surface of a ceramic tile, and assembling a precursor assembly of a direct bonded copper (DBC) substrate by coupling a first leadframe on the sinter precursor material layer on the first surface of the ceramic tile and a second leadframe on the second surface of the sinter precursor material layer on a second surface of the ceramic tile such that the ceramic tile is disposed between the first leadframe and the second leadframe. The method further includes sinter bonding the first leadframe and the second leadframe to the ceramic tile to form a sinter bonded DBC substrate.

In an aspect, sinter bonding the first leadframe and the second leadframe to the ceramic tile to form the sinter bonded DBC substrate includes applying a sintering heat treatment to the precursor assembly at a temperature that is less than 500° C. and a pressure that is less than 100 MPa.

In another aspect, applying the sintering precursor material layer includes metallizing the first surface of the ceramic tile and applying a sintering precursor material layer to the metallized first surface of the ceramic tile.

The details of one or more implementations are set forth in the accompanying drawings and the description below.

Other features will be apparent from the description and drawings, and from the claims.

BRIEF DESCRIPTION OF THE DRAWINGS

FIG. 2 is a flow chart illustration of an example method for fabricating a DBC substrate.

DETAILED DESCRIPTION

Direct bonded copper (DBC) substrates and methods for fabricating the DBC substrates are disclosed herein. A DBC substrate may be intended for use in electronic circuits involving, for example, high-power devices (e.g., silicon power devices such as an insulated-gate bipolar transistor (IGBT), a fast recovery diode (FRD), etc.). The high-power devices may be attached to the DBC substrate and packaged, for example, in single-side cooling (SSC) or dual-side cooling (DSC) power modules. The DBC substrate may include a leadframe, i.e., a thin layer of metal frame, that is typically bonded to a ceramic substrate (e.g., an alumina tile) using high temperature bonding processes (e.g. copper cladding.at temperatures greater than 1000° C.).

The methods for fabricating the DBC substrates described herein involve at least sinter bonding a combination of a leadframe, a sinter material layer and a ceramic tile using bonding processes (e.g. sintering) at low temperatures to avoid defects (e.g., ceramic-copper interfacial voids, cracks, etc.) that can be caused by high temperature bonding (e.g. copper cladding.at temperatures greater than 1000° C.) of the leadframe directly to the ceramic tile.

In accordance with the principles of the present disclosure, in an example DBC substrate, leadframes are sinter bonded to a ceramic tile (e.g., alumina ($Al_2O_3$), aluminum nitride (AlN), boron nitride (BN), silicon nitride (SN), etc.) via a sinter material layer (e.g., Ag material layer) using low temperature sintering processes. The low temperature sintering processes may, for example, involve sintering temperatures of less than about a few hundred degrees Celsius (e.g., 500° C.)

Figure 1A:
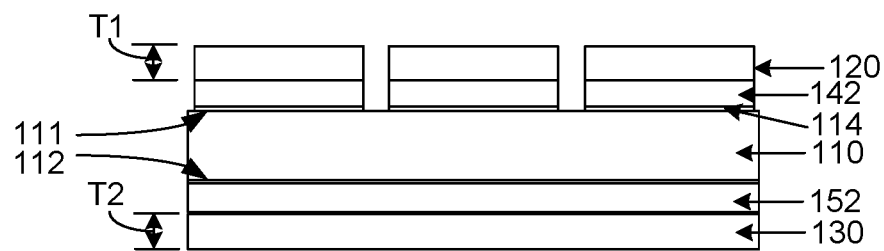
FIG. 1A is an illustration, in cross-sectional view, of an example DBC substrate fabricated using low temperature sintering processes.

FIG. 1A shows, in cross-sectional view, an example DBC substrate fabricated using low temperature sintering processes. DBC substrate 100 includes a ceramic tile 110, a first leadframe 120 and a second leadframe 130. Ceramic tile 110 may be made of thermal conductive electrically-insulating material (e.g. $Al_2O_3$, AlN, BN, SN, etc.). First leadframe 120 and second leadframe 130 may be made of electrically conductive metal or metallic materials (e.g., copper). First leadframe 120 is sinter bonded to a first side 111 of the ceramic tile by, for example, a sinter bond 142. Second leadframe 130 is sinter bonded to a second side 112 of the ceramic tile by, for example, a sinter bond 152. Sinter bond 142 and sinter bond 152 may be made of sinter material (e.g., gold (Au), silver (Ag), copper (Cu), or any mixture thereof, etc.) that can bond leadframes 120 and 130 to the ceramic tile by, for example, sintering processes at lower temperatures (e.g., 500° C. or lower) than the temperatures (e.g., 1000° C. and greater) involved in traditional copper cladding processes of DBC fabrication.

In example implementations, ceramic tile 110 may be metallized, i.e., have a surface covered with an intermediate metal or metallic layer (e.g., layer 114) that promotes bonding of ceramic tile 110 with the sintering material (e.g., sinter bond 142 and sinter bond 152) disposed on the surface of ceramic tile 110. In example implementations, the intermediate metal or metallic layer may be made of an alloy (e.g., a titanium-nickel-silver (TiNiAg) alloy).

In example implementations, ceramic tile 110 may not be metallized, i.e., not covered by the intermediate metal or metallic layer (e.g., layer 114), and the sintering material may be disposed directly on surfaces of ceramic tile 110 to form sinter bonds (e.g., sinter bond 142 and sinter bond 152) between ceramic tile 110 and the leadframes (e.g., first leadframe 120 and second leadframe 130.)

Figure 1B:
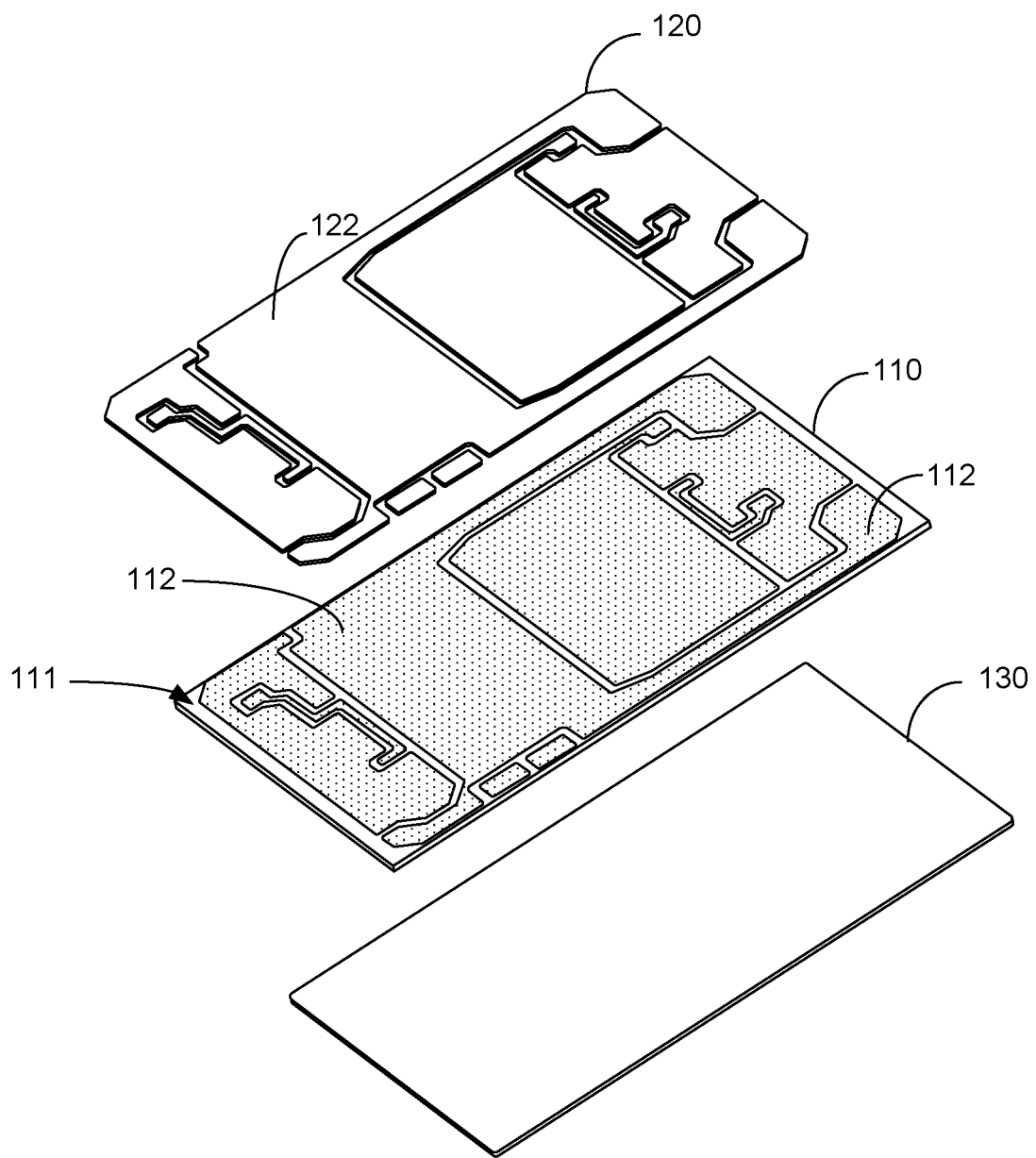
FIG. 1B is an illustration, in a perspective view, of the separated components of the DBC substrate of FIG. 1A.

FIG. 1B shows, for example, in a perspective view, separated components (e.g., ceramic tile 110, leadframe 120 and leadframe 130) of DBC substrate 100 during fabrication. First leadframe 120 may be a patterned conductive metal or metallic sheet (e.g., a trace) to which one or more power semiconductor devices (not shown) may be attached (e.g., using solder or conductive epoxy) in a device package (e.g., an SSC or a DSC power module). In example implementations, leadframe 120 may be patterned (e.g., trace 122) to provide interconnections to, and between, the one or more attached power semiconductor devices. A thin metal or metallic layer 114 (e.g., TiNiAg) is applied to first side 111 of ceramic tile 110 to promote sintering between ceramic tile 110 and leadframe 120. The thin metal or metallic layer 114 may have a pattern that matches the pattern of trace 122 when leadframe 120 is placed on ceramic tile 110.

In example implementations, leadframe 130 may, for example, be a metal or metallic plate (e.g. a copper plate). Leadframe 130 may be a solid metal or metallic plate, or, like leadframe 120, may be a patterned plate (i.e., a trace).

In example implementations, leadframe 120 may, for example, be a copper trace, and leadframe 130 may be a metal foil (e.g., a copper foil).

In example implementations, leadframe 120 may, for example, be a copper trace, and leadframe 130 may be an electrically conductive sheet made of graphite or carbon.

In example implementations, leadframe 120 may, for example, be a copper trace, and leadframe 130 may be a conductive sheet made of thermally conductive material (e.g., thermally conductive material such as ultra-pure BN).

In example implementations, leadframe 120 may, for example, have a thickness T1 of between about 0.05 millimeters and about 3.0 millimeters, and leadframe 130 may, for example, have a similar thickness T2 of between about 0.05 millimeters and about 3.0 millimeters.

In example implementations, leadframe 120 and leadframe 130 may have dissimilar thicknesses. For example, leadframe 120 may have a thickness T1 of between about 0.05 millimeters and about 3.0 millimeters, and leadframe 130 may have a dissimilar thickness T2 of between about 0.1 millimeters and about 5.0 millimeters.

FIG. 2 shows an example method 200 for fabricating a DBC substrate (e.g., DBC substrate 100) using low temperature sintering processes, in accordance with the principles of the present disclosure. The low temperature sintering processes may involve sintering at temperatures less than about 500° C.

The DBC substrate components may include a ceramic tile, a first leadframe, and a second leadframe. The ceramic tile may be a tile made, for example, of thermally conductive electrically-insulating material such as alumina ($Al_2O_3$), BN, SN, or AN. The first leadframe may, for example, a copper sheet with a trace pattern. The trace pattern may, for example, be stamped, micro machined, precision punched out, or cut out (e.g., laser cut, photo-etched), for example, from a solid metal sheet (e.g., a copper sheet). The second leadframe may, for example, be a solid metal sheet (e.g., a copper sheet). In some implementations, the second leadframe also may be a copper sheet with a trace pattern.

Method 200 may include metalizing one or more surfaces of the ceramic tile (e.g., a top surface on one side of the ceramic tile and on a second side of the ceramic tile (210), and applying a sintering precursor material layer to each of a first surface and a second surface of the ceramic tile (220). In an example implementation, the first surface and the second surface may be metalized surfaces of the ceramic tile. In another implementation, the first surface and the second surface may be un-metalized surfaces of the ceramic tile. Whether the first surface and the second surface of the ceramic tile should be metallized may depend on the nature of the sintering precursor material layer used in method 200 at 220.

The sinter precursor material may, for example, may include any type of metal or metallic particles that can bond to the leadframes and the ceramic tile (e.g., ceramic tile 110). The sinter precursor material may, for example, be an Ag based sinter material, for making Ag sinter bonds. The sinter precursor material may, for example, be a Cu based sinter material, for making Cu sinter bonds.

In example implementations of method 200, metalizing surfaces 210 may include depositing (e.g., sputtering, evaporating, electroless plating, electroplating, etc.) an intermediate metal or metallic alloy layer (e.g., TiNiAg) on surfaces of the ceramic tile. The intermediate metal or metallic alloy (e.g., TiNiAg) may promote sinter bonding of the ceramic tile to the sinter precursor material.

Applying the layer of the sinter precursor material 220 may include applying sinter precursor material (e.g., Au, Ag, Cu particles) using either wet state or dry state application techniques. The wet state application techniques may, for example, include, screen or stencil printing, doctor blading, spraying, dipping, and fine needle dispense techniques.

When a wet state application technique is employed, the sinter precursor material may, for example, be a suspension of metal particles in a solvent and/or surfactant that facilitates wet state application. In an example implementation, the wet state coating precursor material may contain metal particles (e.g., Au, Ag, or Cu particles, or a mixture thereof) in combination with a binder (e.g., an epoxy), a dispersant, and a thinner or liquid carrier.

The dry state application techniques may involve a film transfer process to apply the sinter precursor material as a dry film to the appropriate ceramic tile surfaces. The dry film may be prepared, for example, by initially depositing (e.g., screen printing or otherwise dispensing) wet state sinter precursor material onto a temporary substrate or carrier, such as a polymer (e.g., polyethylene terephthalate) tape backing. The sinter precursor material may be applied to the temporary substrate or carrier in a wet, flowable state, and then heated or otherwise dried to yield a dry film that can be transferred to the appropriate surfaces of the ceramic tile.

Method 200 may further include assembling a precursor assembly of the DBC substrate by coupling the first leadframe to the sinter precursor material layer applied on the first surface of the ceramic tile and the second leadframe to the sinter precursor material layer applied on the second surface of the ceramic tile such that the ceramic tile is disposed between the first leadframe and the second leadframe (230), and sinter bonding the first leadframe and the second leadframe to the ceramic tile to obtain a sinter bonded DBC substrate (240).

Figure 3:
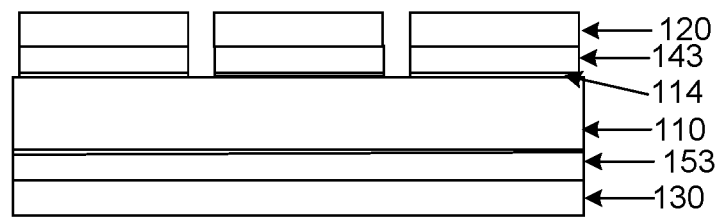
FIG. 3 is an illustration of an example precursor assembly of a DBC substrate that may be assembled by the method of FIG. 2.

FIG. 3 shows an example precursor assembly 300 that may be assembled (at stage 240) by method 200. Precursor assembly 300 may include a combination of a ceramic tile, one of more leadframes, and one or more sinter material layers that can be sinter bonded using bonding processes (e.g. sintering) at low temperatures. For example, precursor assembly 300 may include ceramic tile 110 sandwiched between first leadframe 120 and second leadframe 130. In precursor assembly 300, one or more surfaces of ceramic tile 110 may be metalized, for example, by intermediate metal or metallic alloy (e.g., TiNiAg) coating layers 114. Further, a sinter precursor material layer 143 may be interposed between first leadframe 120 and ceramic tile 110, and a sinter precursor material layer 153 may be interposed between second leadframe 130 and ceramic tile 110.

In method 200, sinter bonding the first leadframe and the second leadframe to the ceramic tile to obtain a sinter bonded DBC substrate 250 may include applying pressure and heat to precursor assembly 300, for example, in a heated press jig.

Figure 4:
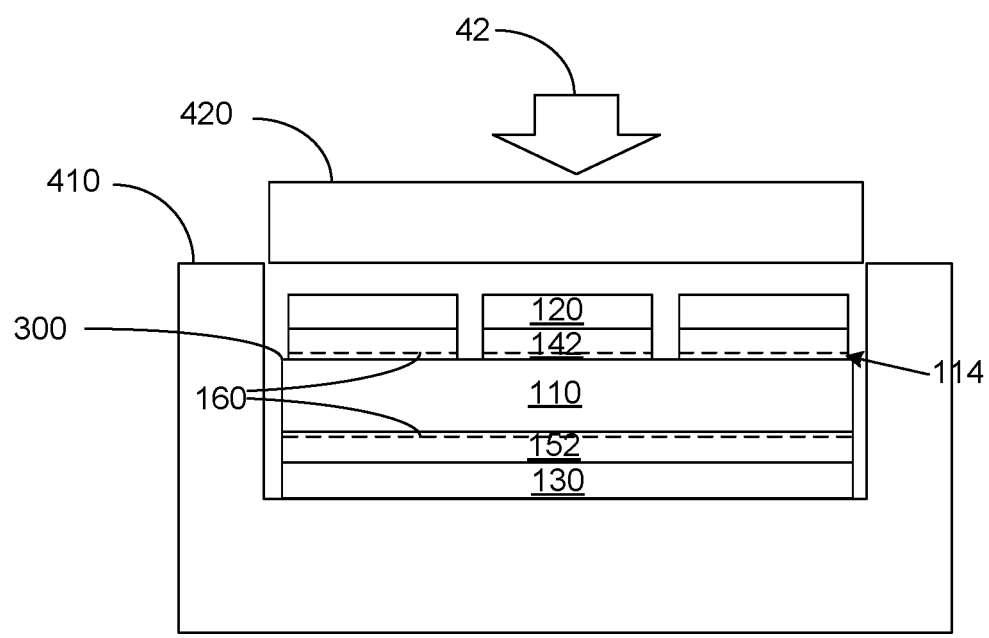
FIG. 4 is an illustration of an example heated press jig used for heat and pressure treatment of a precursor assembly of a DBC substrate.

FIG. 4 shows an example heated press jig 400 that may be used for heat and pressure treatment of precursor assembly 300 for sintering bonding the first leadframe and the second leadframe to the ceramic tile. Heated press jig 400 may include a heated pressure chamber 410 to hold precursor assembly 300, and a movable press 420 that applies pressure (depicted, for example, as arrow 42 in FIG. 4) to precursor assembly 300 held in the pressure chamber.

In example implementations, ceramic tile 110 in precursor assembly 300 may be coated with TiNiAg coating layers 114. Further, sinter precursor material layer 143 and sinter precursor material layer 153 may be Ag based sinter materials. The heat and pressure treatment of precursor assembly 300 in heated press jig 400 in a low temperature sintering process may result in inter diffusion or inter mixing of Ag particles between the TiNiAg coating layers 114 and the sinter precursor material layers (e.g., sinter precursor material layer 143 and sinter precursor material layer 153) to form sinter bond 142 and sinter bond 152 (between ceramic tile 110 and leadframes 120 and 130, respectively). In FIG. 4, for purposes of visual illustration, the inter diffusion or inter mixing of Ag particles between the TiNiAg coating layers and the sinter precursor material layers is depicted by dashed boundary lines 160 between the TiNiAg coating layers 114 and the sinter precursor material layers (e.g., sinter precursor material layer 143 and sinter precursor material layer 153, FIG. 3).

In example implementations, the heat and pressure treatment of precursor assembly 300 for Ag sintering may utilize a sintering temperature between about 200° C. and 300° C., and a pressure between about 10 MPa and 25 MPa.

In example implementations in which the sinter precursor materials are Cu based sinter materials, the heat and pressure treatment of precursor assembly 300 for Cu sintering may utilize a sintering temperature between about 200° C. and about 500° C., and a pressure between about 10 MPa and about 50 MPa. In example implementations, the pressures utilized for Cu sintering may depend on a thickness of the Cu based sinter materials (e.g., layer 143 and 153) in precursor assembly 300. Thicker Cu based sinter material layers may need to be sintered at a higher pressure than thinner Cu based sinter material layers.

In example implementations in which the sinter precursor materials are Ag and Cu mixture based sinter materials, the heat and pressure treatment of precursor assembly 300 for Ag and Cu mixture sintering may utilize a sintering temperature between about 200° C. and 500° C., and a pressure between about 5 MPa and about 100 MPa. The pressures utilized for Ag and Cu mixture sintering may depend on a thickness of the Ag and Cu mixture sinter precursor materials (e.g., layer 143 and 153) in precursor assembly 300. Thicker precursor material layers may need to be sintered at a higher pressure than thinner sinter precursor material layers.

In example implementations, the sinter precursor materials (e.g., layer 143 and 153) in precursor assembly 300 may be pressure less sintering material. In such implementations, the heat and pressure treatment of precursor assembly 300 for may utilize a sintering temperature for pressure less sintering material under no pressure (or under a little pressure merely to hold the components, for example, in place in jig 400).

The low temperature sintering processes of method 200 may enable fabrication of large panel DBC substrates (e.g., greater than four inches on a side) with minimal or no warpage of the DBC components. Example DBC substrates that are low temperature sinter bonded by method 200 may have rectangular panel sizes ranging from about 5"×7" to about 14"×14".

In example implementations, one or more of the sinter precursor materials (e.g., sinter precursor material layer 143 and sinter precursor material layer 153, FIG. 3) that are used to sinter bond leadframes to the ceramic tile may be replaced by low temperature attachment materials (e.g., leaded/lead-free solder, transition liquid phase solder, etc.)

In example implementations, one or more semiconductor device die may be attached to the leadframes of the DBC substrate before low temperature sinter bonding of the leadframes to the ceramic tile. The semiconductor device die (e.g., an IGBT, an FRD, etc.) may be attached (e.g., to leadframe 120) using, for example, solder or conductive adhesives or epoxies.

Figure 5:
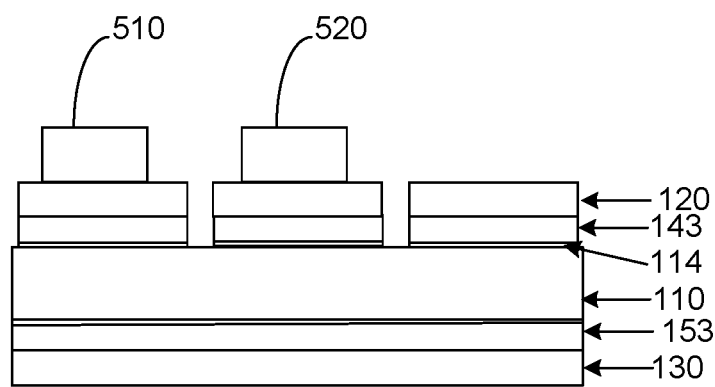
FIG. 5 is an illustration of an example precursor assembly of a DBC substrate.

FIG. 5 shows, for example, a DBC precursor assembly 500 that may be assembled by method 200 (at stage 240) with semiconductor device die 510 (e.g., an IGBT) and semiconductor device die 520 (e.g., an FRD) attached to leadframe 120. Precursor assembly 500 may include ceramic tile 110 sandwiched between first leadframe 120 and second leadframe 130.

In precursor assembly 500, like in precursor assembly 300, one or more surfaces of ceramic tile 110 may be metalized, for example, by intermediate metal or metallic alloy (e.g., TiNiAg) coating layers 114. Further, a sinter precursor material layer 143 may be interposed between first leadframe 120 and ceramic tile 110, and a sinter precursor material layer 153 may be interposed between second leadframe 130 and ceramic tile 110.

Like precursor assembly 300, precursor assembly 500 may be subject to low temperature and pressure sintering processes (e.g., in heated press jig 400) to sinter bond leadframes 120 and 130 to ceramic tile 110.

It will be understood that, in the foregoing description, when an element, such as a layer, a region, a substrate, or component is referred to as being on, connected to, electrically connected to, coupled to, or electrically coupled to another element, it may be directly on, connected or coupled to the other element, or one or more intervening elements may be present. In contrast, when an element is referred to as being directly on, directly connected to or directly coupled to another element or layer, there are no intervening elements or layers present. Although the terms directly on, directly connected to, or directly coupled to may not be used throughout the detailed description, elements that are shown as being directly on, directly connected or directly coupled can be referred to as such. The claims of the application, if any, may be amended to recite exemplary relationships described in the specification or shown in the figures.

As used in the specification and claims, a singular form may, unless definitely indicating a particular case in terms of the context, include a plural form. Spatially relative terms (e.g., over, above, upper, under, beneath, below, lower, and so forth) are intended to encompass different orientations of the device in use or operation in addition to the orientation depicted in the figures. In some implementations, the relative terms above and below can, respectively, include vertically above and vertically below. In some implementations, the term adjacent can include laterally adjacent to or horizontally adjacent to.

Some implementations may be implemented using various semiconductor processing and/or packaging techniques. Some implementations may be implemented using various types of semiconductor processing techniques associated with semiconductor substrates including, but not limited to, for example, Silicon (Si), Gallium Arsenide (GaAs), Gallium Nitride (GaN), Silicon Carbide (SiC) and/or so forth.

While certain features of the described implementations have been illustrated as described herein, many modifications, substitutions, changes and equivalents will now occur to those skilled in the art. It is, therefore, to be understood that the appended claims are intended to cover all such modifications and changes as fall within the scope of the implementations. It should be understood that they have been presented by way of example only, not limitation, and various changes in form and details may be made. Any portion of the apparatus and/or methods described herein may be combined in any combination, except mutually exclusive combinations. The implementations described herein can include various combinations and/or sub-combinations of the functions, components and/or features of the different implementations described.

What is claimed is:

1. A direct bonded copper (DBC) substrate, comprising:
   a ceramic tile;
   an intermediate metal layer disposed directly on a surface of the ceramic tile between the ceramic tile and a sinter material layer disposed on a side of the ceramic tile, the sinter material layer being made of metal particles, the intermediate metal layer having a portion inter diffused into the sinter material layer; and
   a leadframe sinter bonded to the side of the ceramic tile by the sinter material layer.

2. The DBC substrate of claim 1, wherein a surface of the ceramic tile is metallized by the intermediate metal layer, the intermediate metal layer including at least one of a titanium-nickel-silver (TiNiAg), a nickel-silver (NiAg) layer, or a silver (Ag) layer.

3. The DBC substrate of claim 1, wherein the ceramic tile is at least one of an alumina tile, an aluminum nitride tile, a silicon nitride, or a boron nitride tile.

4. The DBC substrate of claim 1, wherein the leadframe is an electrically conductive metal trace.

5. The DBC substrate of claim 1, wherein the leadframe is one of an electrically conductive metal trace, a solid metal sheet, a metal foil, or a conductive sheet made of boron nitride, graphite or carbon.

6. The DBC substrate of claim 1, wherein the sinter material layer includes a silver-based sinter material, copper-based sinter material, gold-based sinter material, or a combination thereof.

7. The DBC substrate of claim 1, wherein the leadframe has a thickness of between about 0.05 millimeters and about 3.0 millimeters.

8. The DBC substrate of claim 1, wherein the leadframe sinter bonded to the side of the ceramic tile is free of temperature-induced warpage caused by sinter temperatures greater than 1000° C.

9. An assembly, comprising:
   a ceramic tile, the ceramic tile having a first intermediate metal layer disposed directly on a first surface of the ceramic tile between the ceramic tile and a first sintering precursor material layer disposed on a first side of the ceramic tile and having a second intermediate metal layer disposed directly on a second surface of the ceramic tile between the ceramic tile and a second sintering precursor material layer disposed on a second side of the ceramic tile, the first intermediate metal layer having a portion inter diffused into the first sintering precursor material layer and the second intermediate metal layer having a portion inter diffused into the second sintering precursor material layer;
   a first leadframe coupled to the first sintering precursor material layer on the first side of the ceramic tile; and
   a second leadframe coupled to the second sintering precursor material layer on the second side of the ceramic tile such that the ceramic tile is disposed between the first leadframe and the second leadframe.

10. The assembly of claim 9, wherein the first intermediate metal layer includes at least one of a titanium-nickel-silver (TiNiAg), a nickel-silver (NiAg) or a silver (Ag) layer.

11. The assembly of claim 9, wherein the first intermediate metal layer and the first sintering precursor material layer bond the first leadframe to the ceramic tile at a sintering pressure that is less than 100 MPa and or a sintering temperature that is less than 500° C.

12. The assembly of claim 9, wherein the ceramic tile is at least one of an alumina tile, an aluminum nitride tile, a silicon nitride, or a boron nitride tile.

13. The assembly of claim 9, wherein the first leadframe includes an electrically conductive metal trace.

14. The assembly of claim 9, wherein the second leadframe includes one of an electrically conductive metal trace, a solid metal sheet, a metal foil, or a conductive sheet made of boron nitride, graphite or carbon.

15. The assembly of claim 9, wherein the first sintering precursor material layer includes one of silver-based sinter material, copper-based sinter material, gold-based sinter material, or a combination thereof.

16. The assembly of claim 9, further comprising, at least one semiconductor device die coupled to the first leadframe.

17. The assembly of claim 9, wherein at least one of the first leadframe or the second leadframe has a thickness of between about 0.05 millimeters and about 3.0 millimeters.

18. The assembly of claim 9, wherein the first leadframe has a thickness of between about 0.05 millimeters and about 3.0 millimeters, and the second leadframe has a dissimilar thickness of between about 0.1 millimeters and about 5.0 millimeters.

19. An assembly, comprising:
a ceramic tile having a first intermediate metal layer disposed directly on a first surface of the ceramic tile between the ceramic tile and a first unsintered sintering precursor material layer disposed on a first side of the ceramic tile, and having a second intermediate metal layer disposed directly on a second surface of the ceramic tile between the ceramic tile and a second unsintered sintering precursor material layer disposed on a second side of the ceramic tile, wherein the first and second intermediate metal layers each include at least one of a titanium-nickel-silver (TiNiAg), a nickel-silver (NiAg) or a silver (Ag) layer;
a first leadframe coupled to the first unsintered sintering precursor material layer on the first side of the ceramic tile; and
a second leadframe coupled to the second unsintered sintering precursor material layer on the second side of the ceramic tile such that the ceramic tile is disposed between the first leadframe and the second leadframe, the assembly forming a precursor of a direct bonded copper (DBC) substrate.

20. The assembly of claim 19, wherein the first intermediate metal layer and the first unsintered sintering precursor material layer sinter bond the first leadframe to the ceramic tile at a sintering pressure that is less than 100 MPa and or a sintering temperature that is less than 500° C.

* * * * *